United States Patent [19]

Hareyama et al.

[11] Patent Number: 4,503,421

[45] Date of Patent: Mar. 5, 1985

[54] DIGITAL TO ANALOG CONVERTER

[75] Inventors: Kyuichi Hareyama; Kenji Shiraki; Kazuo Ryu, all of Tokyo, Japan

[73] Assignee: Nippon Electric Co., Ltd., Tokyo, Japan

[21] Appl. No.: 382,189

[22] Filed: May 26, 1982

[30] Foreign Application Priority Data

May 27, 1981 [JP] Japan .................................. 56-80404

[51] Int. Cl.³ ............................................. H03K 13/02
[52] U.S. Cl. ......................... 340/347 DA; 340/347 CC
[58] Field of Search ................. 340/347 DA, 347 CC, 340/347 M

[56] References Cited

U.S. PATENT DOCUMENTS

| | | | |
|---|---|---|---|
| 3,217,147 | 11/1965 | Chapman | 340/347 DA |
| 3,317,905 | 5/1967 | Hunt | 340/347 DA |
| 3,588,882 | 6/1971 | Propster | 340/347 DA |
| 4,016,555 | 4/1977 | Tyrrel | 340/347 DA |
| 4,393,370 | 7/1983 | Hareyama | 340/347 DA |
| 4,412,208 | 10/1983 | Akazawa | 340/347 DA |
| 4,430,642 | 2/1984 | Weigand | 340/347 DA |

Primary Examiner—Charles D. Miller
Attorney, Agent, or Firm—Laff, Whitesel, Conte & Saret

[57] ABSTRACT

A digital to analog converter having an improved conversion linearity is disclosed.

The digital to analog converter comprises means for receiving an input digital signal (1), means for dividing the first digital signal to a plurality of digital signals (2, 3), a plurality of conversion means (8, 9) for converting the divided digital signals to analog signals, respectively, and means (10) for summing the analog signals to produce a summed analog signal corresponding to the input digital signal.

9 Claims, 16 Drawing Figures

| ANALOG VALUE | "A" (9 BIT) | "B" (8 BIT) | "C" (8 BIT) |
|---|---|---|---|
| 511 | 111----1111 | 111----1111 | 1000----0000 |
| 510 | 111----1110 | 111----1111 | 111----1111 |
| 509 | 111----1101 | 111----1110 | 111----1111 |
| 508 | 111----1100 | 111----1110 | 111----1110 |
| 507 | 111----1011 | 111----1101 | 111----1110 |
| ⋮ | ⋮ | ⋮ | ⋮ |
| 258 | 100---0010 | 100----0001 | 100----0001 |
| 257 | 100---0001 | 100---0000 | 100---0001 |
| 256 | 100---0000 | 100----0000 | 100---0000 |
| 255 | 011---1111 | 011----1111 | 100---0000 |
| 254 | 011----1110 | 011----1111 | 011----1111 |
| ⋮ | ⋮ | ⋮ | ⋮ |
| 5 | 00---0101 | 00----010 | 00----011 |
| 4 | 00---0100 | 00----010 | 00----010 |
| 3 | 00---0011 | 00----001 | 00----010 |
| 2 | 00---0010 | 00----001 | 00----001 |
| 1 | 00---0001 | 00----000 | 00----001 |
| 0 | 000000000 | 00----000 | 00----000 |

COMPLIMENTARY CURRENT SOURCE SWITCH CELL

DIGITAL TO ANALOG CONVERTER

BACKGROUND OF THE INVENTION

The present invention relates to a digital to analog converter (hereinafter abbreviated as DAC).

At present, owing to the progress in the integrated circuit technology, DACs having a resolution of 8 to 10 bits have become to be mass-produced stably with a high reliability.

However, mutual matching capabilities between the elements produced by the integrated circuit technology have been inherently limited, and hence it has been very difficult to realize a DAC having a high resolution. For instance, in order to realize a high resolution DAC of 12 to 16 bits it is necessary either to employ a method for constructing of discrete parts in which resistor elements having a good matching capability are independently used or to employ a method for fine adjustment relying upon function trimming by making use of a laser beam, and therefore, not only the manufacturing cost has been very high, but also the reliability of the elements has been lowered.

SUMMARY OF THE INVENTION

It is one object of the present invention to provide a digital to analog converter in which a high resolution can be realized without employing external adjustment, trimming, corrective operations, and the like.

It is another object of the present invention to provide a digital to analog converter suitable for fabrication by integrated circuit technology.

The analog to digital converter according to the present invention comprises means for receiving an input digital signal of a first number of bit length, means for dividing the input digital signal to a plurality of digital signals of a second smaller number of bit length, the total value of the divided digital signals being equal to the valve of the input digital signals, a plurality of conversion means for converting the divided digital signals to analog signals, respectively, and means for summing the analog signals in value, in which the summed analog signal corresponds to the input digital signal.

According to the present invention, even if the respective conversion means have different conversion characteristics, e.g. different gain factors, such conversion means operate in parallel as a whole and in a repeated order, and hence the respective inherent conversion characteristics of the conversion means are neutralized. As a result, the relation between the summed analog signal and the input digital signal can be made substantially linear.

Furthermore, according to the present invention, the respective conversion means do not require a relatively high resolution and high linearity, and hence they can be fabricated with ease by known integrated circuit technology. As the mentioned conversion means, known digital to analog converters may be used. According to one aspect of the present invention, there is provided a digital to analog converter comprising first setup means for deriving more significant N-1 bits as second data among first data consisting of N bits as second data, arithmetic means for adding the second data to the least significant bit of the first data thereby to generate third data, second setup means for deriving the output of the arithmetic means as third data, first application means for applying the second data to a first basic DAC, second application means for applying said third data to a second basic DAC, and adder means for adding the respective outputs of the first and second basic DACs to each other, the first data being an input of the digital-analog converter, and the output of the adder means being a converted output of the digital-analog converter.

It is to be noted that the above-referred N represents a positive integer of 2 or more.

According to the present invention, especially in the case where arithmetic means such as micro-computers or the like intervene, it is possible to output the results of operations to a plurality of individual basic DACs and add the outputs of these plurality of basic DACs, and thereby a desired analog output for a digital set value can be obtained.

BRIEF DESCRIPTION OF THE DRAWINGS

The above-mentioned and other objects, features and advantages of the present invention will become more apparent by reference to the following description of preferred embodiments of the invention taken in conjunction with the accompanying drawings, wherein.

DETAILED DESCRIPTION OF THE INVENTION

Figure 1:
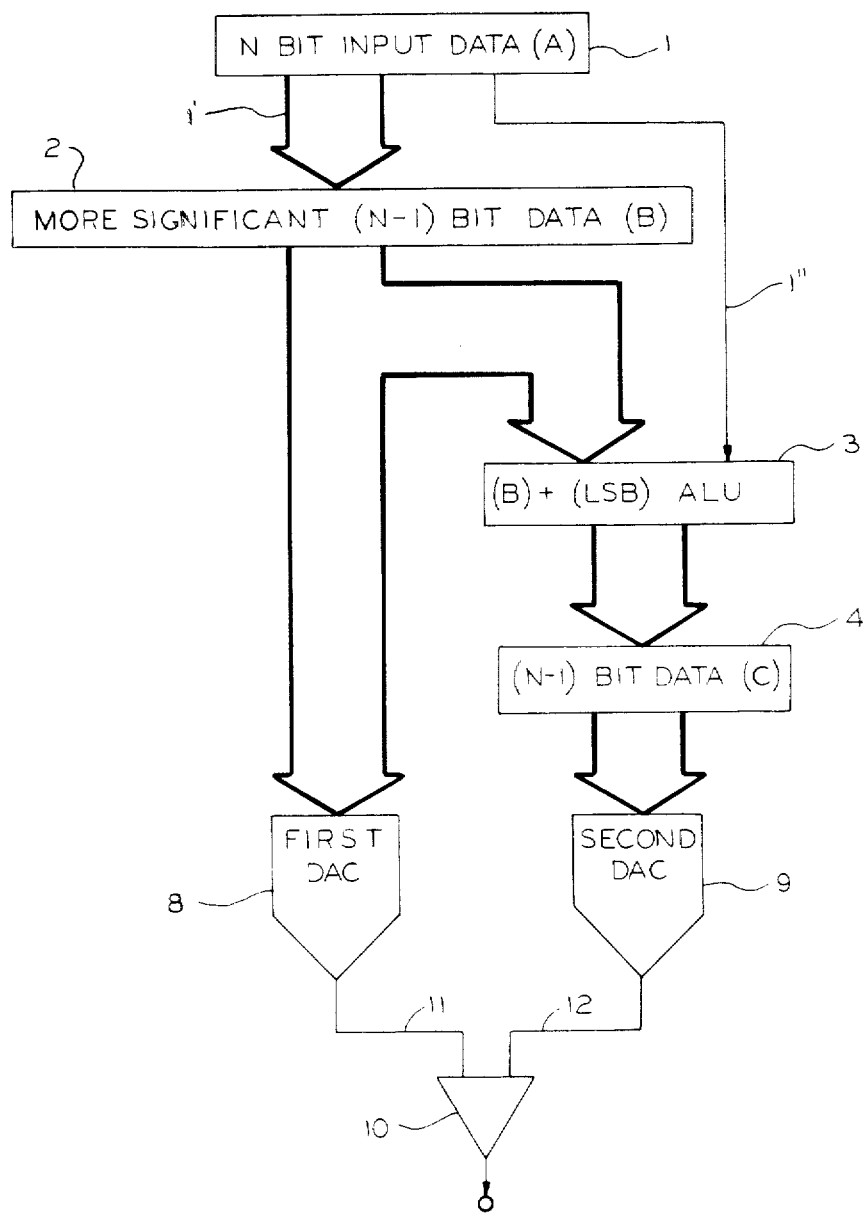
FIG. 1 is a block diagram showing a basic embodiment of the present invention.

Now the principle of the present invention will be described with reference to FIG. 1. Here, by way of example, description will be made on the case where 9-bit digital data is divided into two 8-bit digital data and the two 9-bit data are subjected to conversion operation. These two 8-bit digital data are respectively transferred to corresponding basic DACs.

First data (A) of N-bit are held, in an input register 1. Among the N-bit data (A), the more significant (N-1)-bit data 1' including the most significant bit (MSB) to the (n-1)-th significant bit, form second data (B). These second data (B) are held in a register 2 and transferred to a first DAC 8. The least significant (LSB) 1" of the aforementioned N-bit data (A) is transferred to an arithmetic circuit 3 jointly with the second data (B) to be added together, and new (N-1)-bit data are derived therefrom as third data (c). These third data (C) are temporarily held in a register 4 and transferred to a second DAC 9. Here, it is possible to transfer the data (B) and (C) to the DACs 8 and 9 without via the registers 2 and 4, respectively. An analog output 11 of the first DAC 11 and an analog output 12 of the second DAC 9 are inputted to an adder 10 and added together. The sum of the two analog outputs 11 and 12 is derived from an output terminal 13 as a converted analog output of the data (A). In the event that the first DAC 8 and the second DAC 9 both have current outputs, there is no need to especially provide the adder 10, but the respective current outputs are added together by connecting the respective current output terminals 11 and 12, and the sum current serves as the converted analog output.

Figure 2:
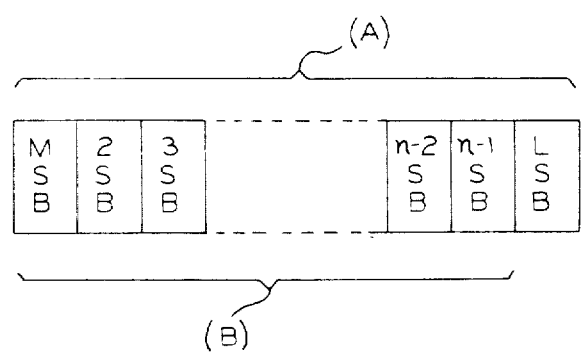
FIG. 2 is a diagramatic view showing a data construction.

Data constructions of the N-bit data (A) and the more significant (N-1) bit data (B) is shown in FIG. 2.

Figures 3, 4:
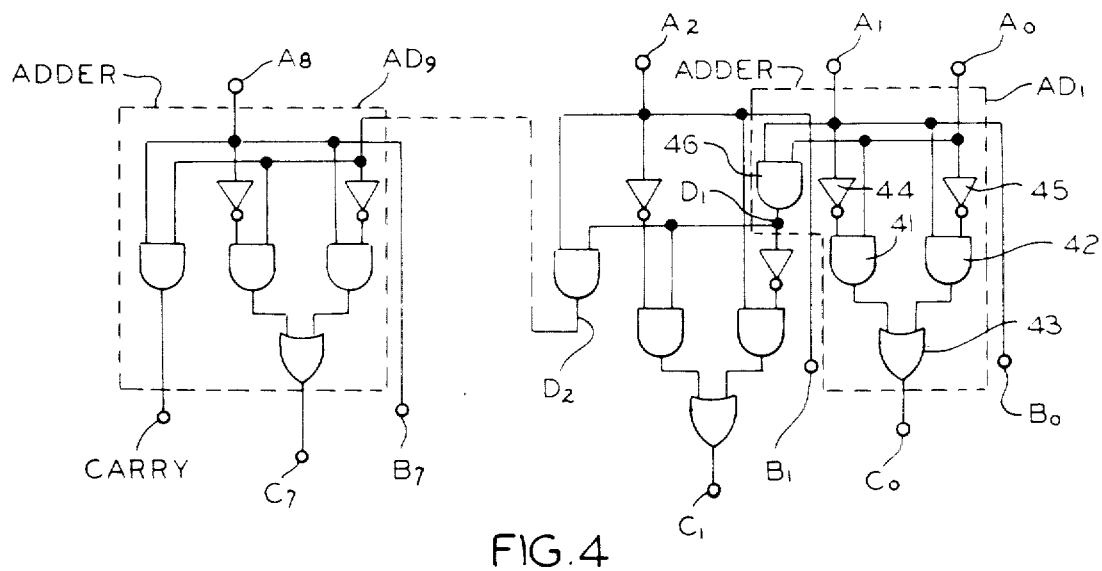
FIG. 3 is an input-output code correlation diagram for an operation circuit.
FIG. 4 is a circuit diagram showing one preferred embodiment of an arithmetic circuit to be used according to the present invention.

A code correlation diagram indicating the correlation between the input and output data of the arithmetic circuit illustrated in FIG. 1, is shown in FIG. 3. In this instance, N=9 is assumed, and hence correlation between 9-bit input data (A) and 8-bit operated output data (B) and (C) is illustrated. In response to every increase of the 9-bit input data (A) by an increment of 1, the 8-bit output data (B) and (C) increase alternately by an increment of 1. For instance, when the analog value is 0, the data (A) are 000000000, and hence the data (B) and (C) are both 00000000. Next, when the analog value is 1, the data (A) are increased to 000000001, the data (B) are still 00000000, but the data (C) are increased to 00000001. Subsequently, when the analog value is increased to 2, the data (A) become 000000010, and the data (B) are increased to 00000001 similarly to the data (C). Thus, the equivalence between total value of the data (B) and the data (C) and the data (A) is maintained. In FIG. 4 is shown one preferred embodiment of the (B)+(LSB) arithmetic circuit 3 in FIG. 1. To an input $A_0$ are applied the LSB data in FIG. 2, and to inputs $A_1$ to $A_8$ are applied the data (B). The circuit 3 is composed of 9 digits of unit adder circuits $AD_1$ to $AD_9$. Each of the unit adder circuits includes an exclusive-OR circuit composed of AND gates 41 and 42, inverter circuits 44 and 45 and an OR gate 43 and a carry circuit composed of an AND gate 46. In this structure, the bits $A_1$ to $A_8$ forming the more significant (N-1) data are treated as the data (B) composed of bits $B_0$ to $B_7$. While, the data (C) is obtained by adding LSB $A_0$ of the data (A) to the data (B), and hence the respective bits $C_0$ to $C_7$ are derived from the respective exclusive-OR circuits of the unit adder circuits $AD_1$ to $AD_9$. To the unit adder circuit $AD_1$ the bit $A_0$ as the LSB of the data (A) and the bit $A_1$ corresponding to the LSB of the data (B) are applied. While, to the unit adder circuits $AD_2$ to $AD_9$ the respective bits $A_2$ to $A_8$ as the remaining bits of the data (B) are applied which are added with the carry signal supplied from the carry circuits from the previous bit positions, respectively.

The input-output relations of this arithmetic circuit 3 are shown in the following tables:

| Input Terminals | | Output Terminals | |
|---|---|---|---|
| $A_0$ | $A_1$ | $D_0$ | $D_1$ |
| 0 | 0 | 0 | 0 |
| 1 | 0 | 1 | 0 |
| 0 | 1 | 1 | 0 |
| 1 | 1 | 0 | 1 |

| Input Terminals | | Output Terminals | |
|---|---|---|---|
| $D_1$ | $A_2$ | $C_1$ | $D_2$ |
| 0 | 0 | 0 | 0 |
| 1 | 0 | 1 | 0 |
| 0 | 1 | 1 | 0 |
| 1 | 1 | 0 | 1 |

Subsequently similar tables are established. As a result, at the output terminals $C_1$ to $C_7$ are obtained output data (C) for the addition of the data (B) applied to the input terminals $A_1$ to $A_8$ plus the LSB data applied to the input bit $A_0$. In addition, a major carry upon overflow of the data (C) is derived from a terminal CARRY of the circuit $AD_9$.

Figure 5:
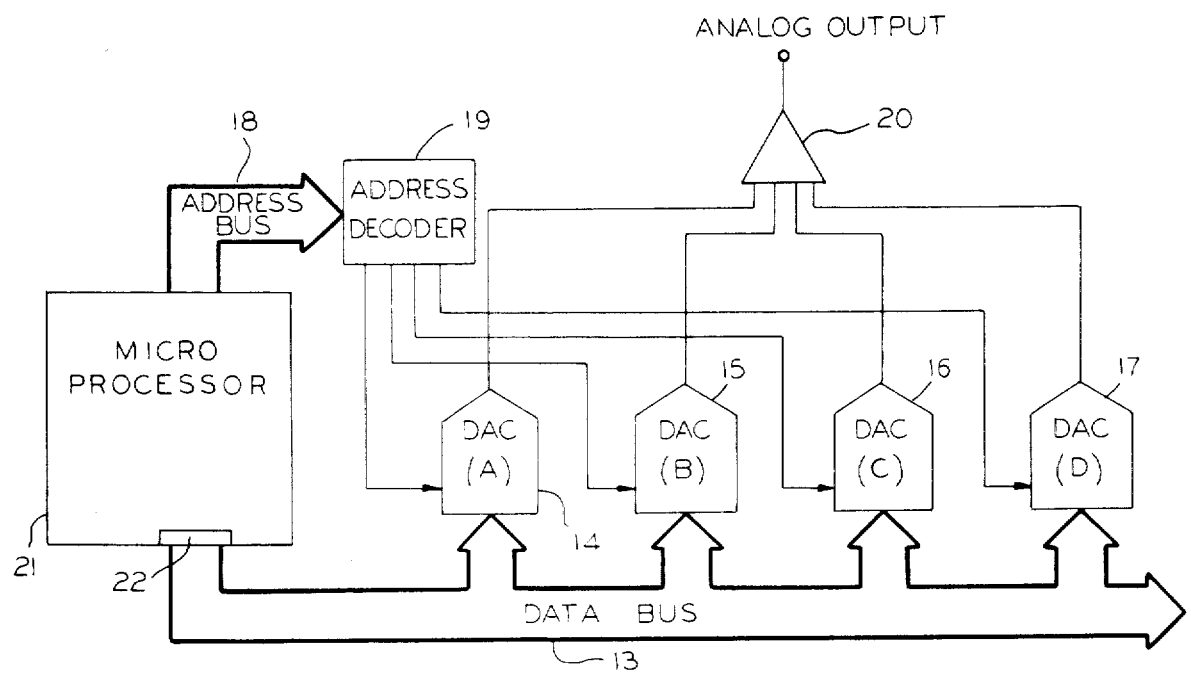
FIG. 5 is a block diagram showing a construction of another preferred embodiment of the present invention in the case where arithmetic units such as micro-computers or the like are used.

In FIG. 5 is shown another preferred embodiment of the present invention in which arithmetic units such as micro-processors or the like are employed. In a micro-processor 21, arithmetic operations are carried out to produce 4 data blocks which are placed on a data bus 13 through an output port 22 to write data into four basic DACs (DAC[A] through DAC[D]) which are designated by control data appearing on an address bus 18. These data are decoded by an address decoder 19. The four written data blocks are similar to those produced in FIG. 16. The analog outputs from these DACs are added together by an analog adder 20 to provide a desired output signal.

Figure 6:
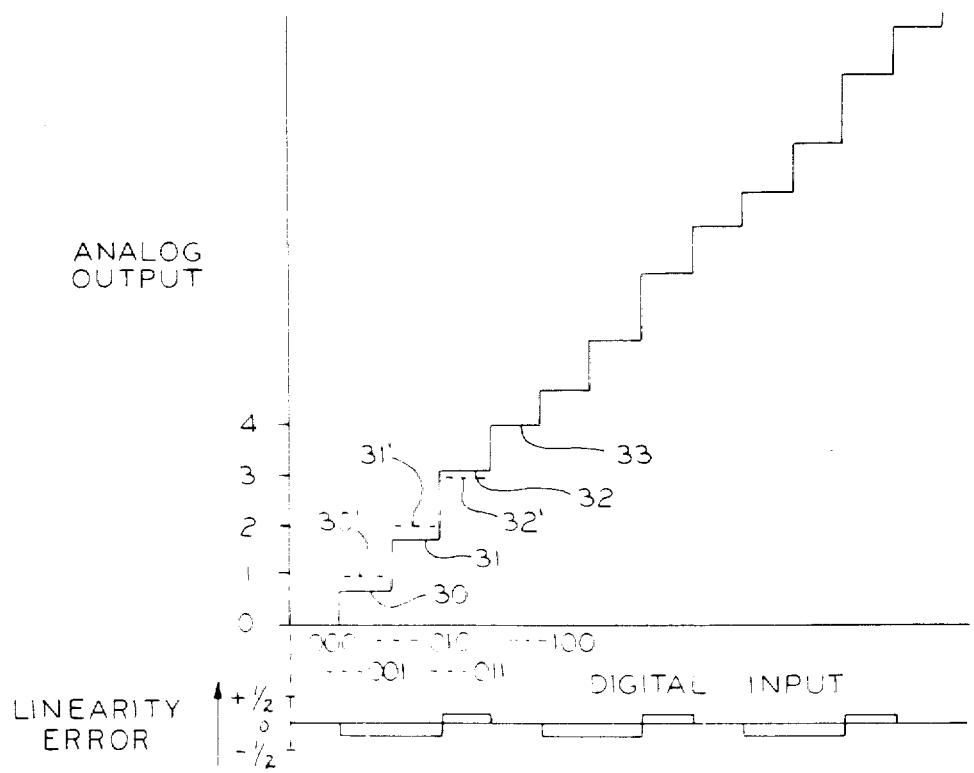
FIG. 6 is a diagram showing the effects of the embodiment shown in FIG. 5.

Now description will be made on a composite error in the case where four basic DACs having very large gain factors (gain errors) are used in the subject system with reference to FIG. 6. Here, DAC[A] having a gain factor of 0.7, DAC[B] having a gain factor of 1.0, DAC[C] having a gain factor of 1.4 and DAC[D] having a gain factor of 0.9 are assumed. In the system according to the present invention, owing to the fact that the DAC[A], DAC[B], DAC[C] and DAC[D] having the above-assumed respective gain factors step up successively in the illustrated sequence (the first step 30 to the fourth step 33) and moreover while repeating this sequence, the analog output increments are averaged, and despite of the above-assumed large distribution of gain factors, a linearity error falls within ½ LSB.

Namely, the outputs the basic DACs DAC[A], DAC[B], DAC[C] and DAC[D] are sequentially incremented by one in accordance with the continuous increase of the digital input (data (A)). Then, the basic DAC DAC[A] produces an analog output of 37 1" in response to the digital input "...001". In this response, the gain factor of DAC[A] is 0.7 and hence the analog output 30 at this instance is smaller than the specified analog output 30' corresponding "1" by 0.3. Next, when the digital input becomes "...010", the DAC[B] is enabled to produce the analog output of "1" as well as the DAC[A]. The output of the DAC[B] is added to the output of the DAC[A] to generate the analog output of "2" as indicated by 31. The gain factor of the DAC[B]

is 1 and hence the analog output 31 thus obtained is smaller than the specified value of "2" indicated by −' by 0.3. When the digital input is " . . . 011", the output corresponding to "1" value from the DAC[C] is also added to the outputs of the DAC[A] and the DAC[B]. In this case, the gain factor of the DAC[C] is 1.4, and hence the analog output 32 takes a larger value than the specified "3" value 32' by 0.1. Then, the digital input becomes " . . . 101", the output of the DAC[D] is added to the outputs of the DAC[A], DAC[B] and DAC[C]. In this instance, since the gain factor of the DAC D is 0.9, the analog output 33 corresponds to the specified value of "4".

In this manner, the outputs of the respective basic DACs are added to produce the analog output, and therefore the gain factors of the respective basic DACs are made averaged.

Normally in a monolithic integrated circuit, since gain errors among DACs formed on the same chip would not exceed 10%, the gain errors among the DACs would influence the composite error only to a negligible extent. Accordingly, if the individual basic DAC[A], DAC[B], DAC[C] and DAC[D] have their linearity errors guaranteed for their respective resolutions, then the linearity error of the entire system is guaranteed to be within $\pm \frac{1}{2}$ LSB, and therefore, a high precision of the DAC system can be guaranteed without requiring a precision higher that that corresponding to a resolution for the individual basic DACs.

Figure 7:
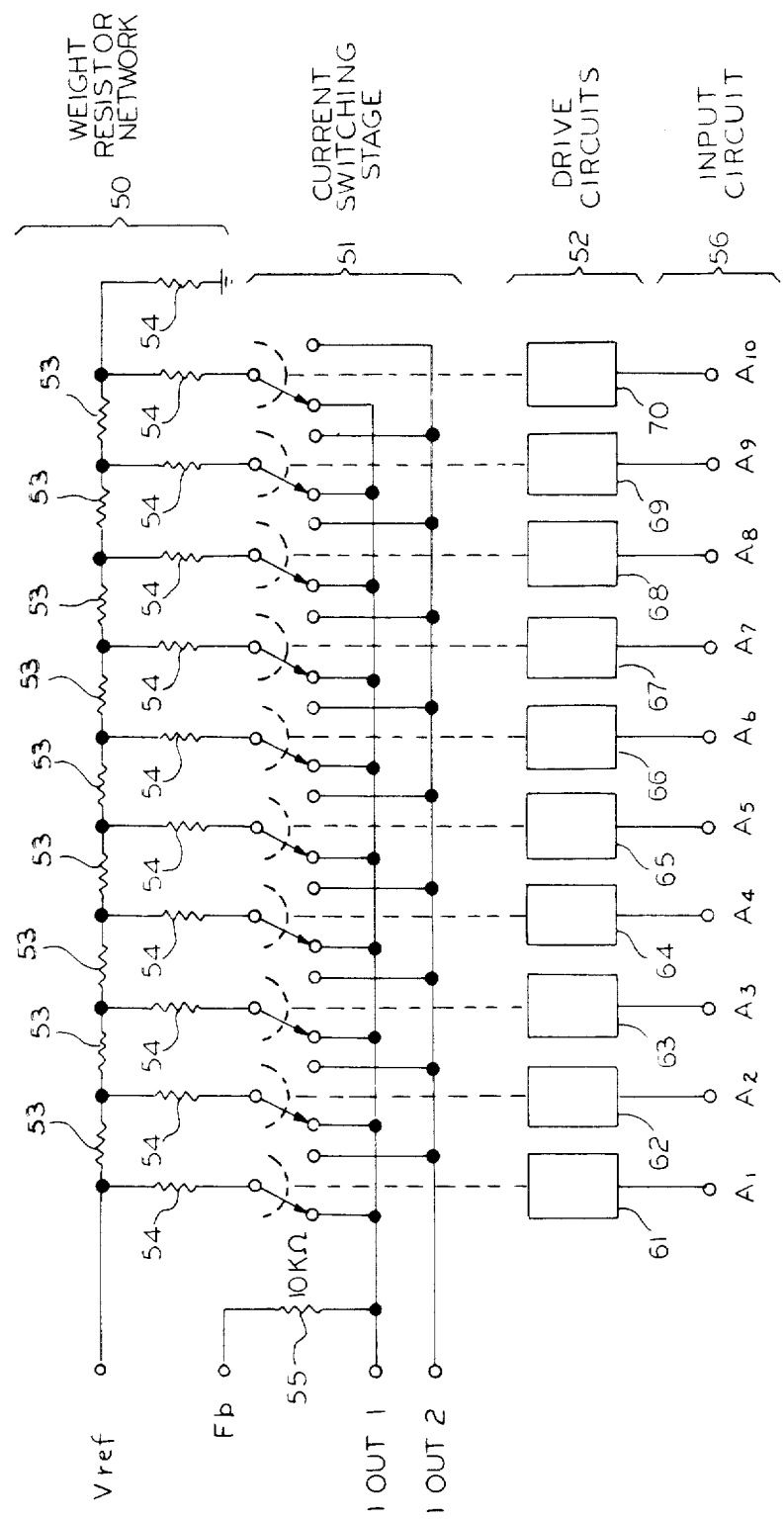
FIG. 7 is a block diagram showing a construction of a basic DAC which is available in practicing the present invention.

Now description will be made on a construction of a digital-analog converter such as the first and second basic DACs 8 and 9 in FIG. 1 or the basic DAC[A] to DAC[D] in FIG. 5. FIG. 7 shows one example of the structure of the basic DAC. In a weight resistor network 50 disclosed in FIG. 7, the so-called R-2R ladder circuit is used, in which a resistor 53(R) in a first group is chosen to be 10 KΩ and a resistor 54 (2R) in a second group is chosen to be 20 KΩ. In addition, another resistor 55 in a feedback impedance circuit is chosen to be 10 KΩ. For a current switch group 51 and a drive circuit group 52, FETs of complementary MOS (hereinafter abbreviated as (MOS) type are used. The output for each bit of the resistor network 50 is connected to a movable contact of the corresponding switch in the current switch group 51, so that it may be terminated at either a first output $I_{OUT1}$ or a second output $I_{OUT2}$ depending upon digital inputs applied to an input circuit 56. The respective switches in this current switch group 51 are driven by the corresponding one of drive circuits 61 to 70 in the drive circuit group 52, and to the respective input terminals of the input circuit 56 are applied digital inputs $A_1$ to $A_{10}$. The digital input $A_1$ is the most significant bit, while the digital input $A_{10}$ is the least significant bit, these inputs $A_1$ to $A_{10}$ form binary weight bits, and the current switch group 51 leads binary weighted currents either to the first output terminal $I_{OUT1}$ or to the second output terminal $I_{OUT2}$. In the case where a plurality of such DACs are used, a current represented a totalized analog value is obtained by connecting the first output terminals $I_{OUT1}$ of the respective basic DACs together and also connecting the second output terminals $I_{OUT2}$ of the respective basic DACs together.

Figure 8:
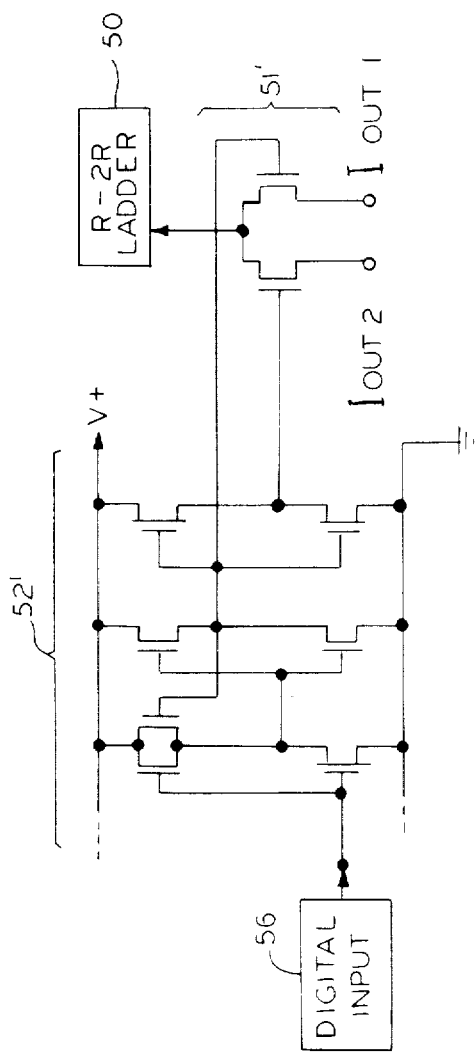
FIG. 8 is partial construction diagram showing a 1-bit section of the DAC shown in FIG. 7.

FIG. 8 shows a circuit portion 52' and 51' for arbitrary one bit in the drive circuit group 52 and the current switch group 51 in FIG. 7. The current switch portion 51' is composed of two FETs of the same conductivity type, and in the illustrated case they are both N-channel FETs. To the gate of one FET that is conducting in this current switch 51' is applied a voltage V+ from the drive circuit 52', whereas the ground potential is applied to the gate of the FET that is non-conducting. Hence, one output terminal of the ladder resistor network 50 is connected either to the output terminal $I_{OUT1}$ or to the output terminal $I_{OUT2}$ by one FET that is then conducting. The DAC illustrated in FIGS. 7 and 8 is favorable to be used as the basic DAC shown in FIG. 1 or in FIG. 5.

Figure 9:
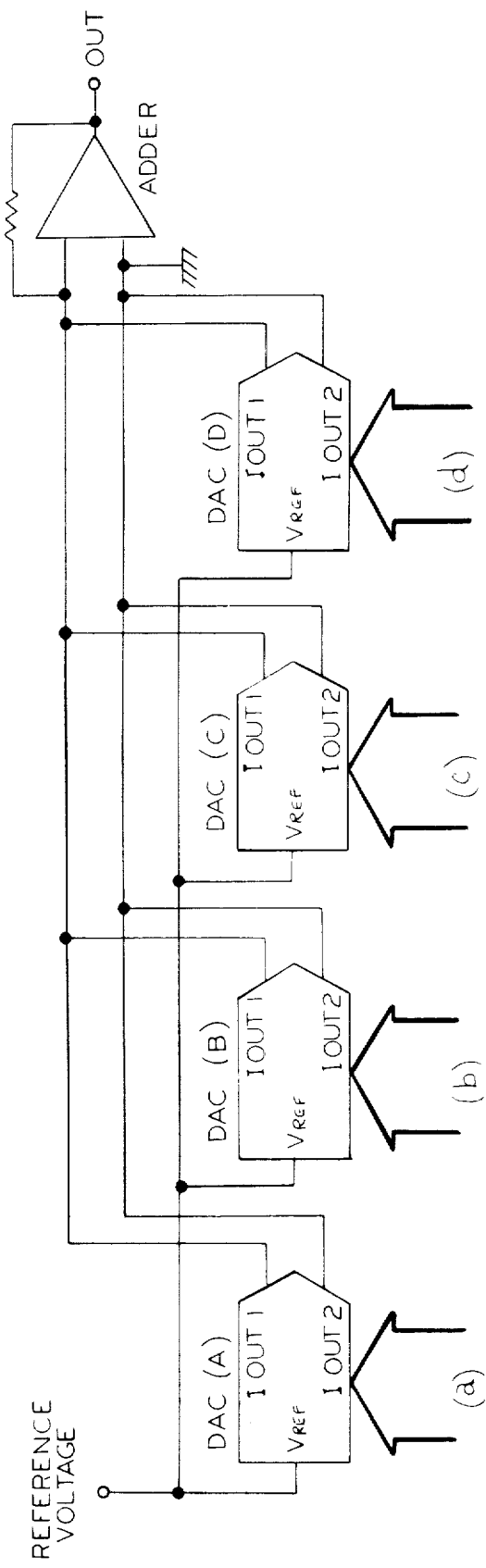
FIG. 9 is a construction diagram of one preferred embodiment of the present invention which makes use of the basic DAC shown in FIG. 7.

One example of a circuit arrangement for employing four such DACs practically as the DAC[A] to DAC[D] in FIG. 5 is illustrated in FIG. 9. In this circuit arrangement, the corresponding output terminals $I_{OUT1}$ or $I_{OUT2}$ of the respective DACs are connected in common and connected to the corresponding input terminal of an adder-amplifier, and the output of the amplifier is derived as an added output. To the respective DACs [A] ~ [D] are applied four sets of divided data [a] ~ [d], respectively, and the output currents of the respective DACs are added together by the above-mentioned adder-amplifier, from which the total sum of the output currents is derived.

Figure 10:
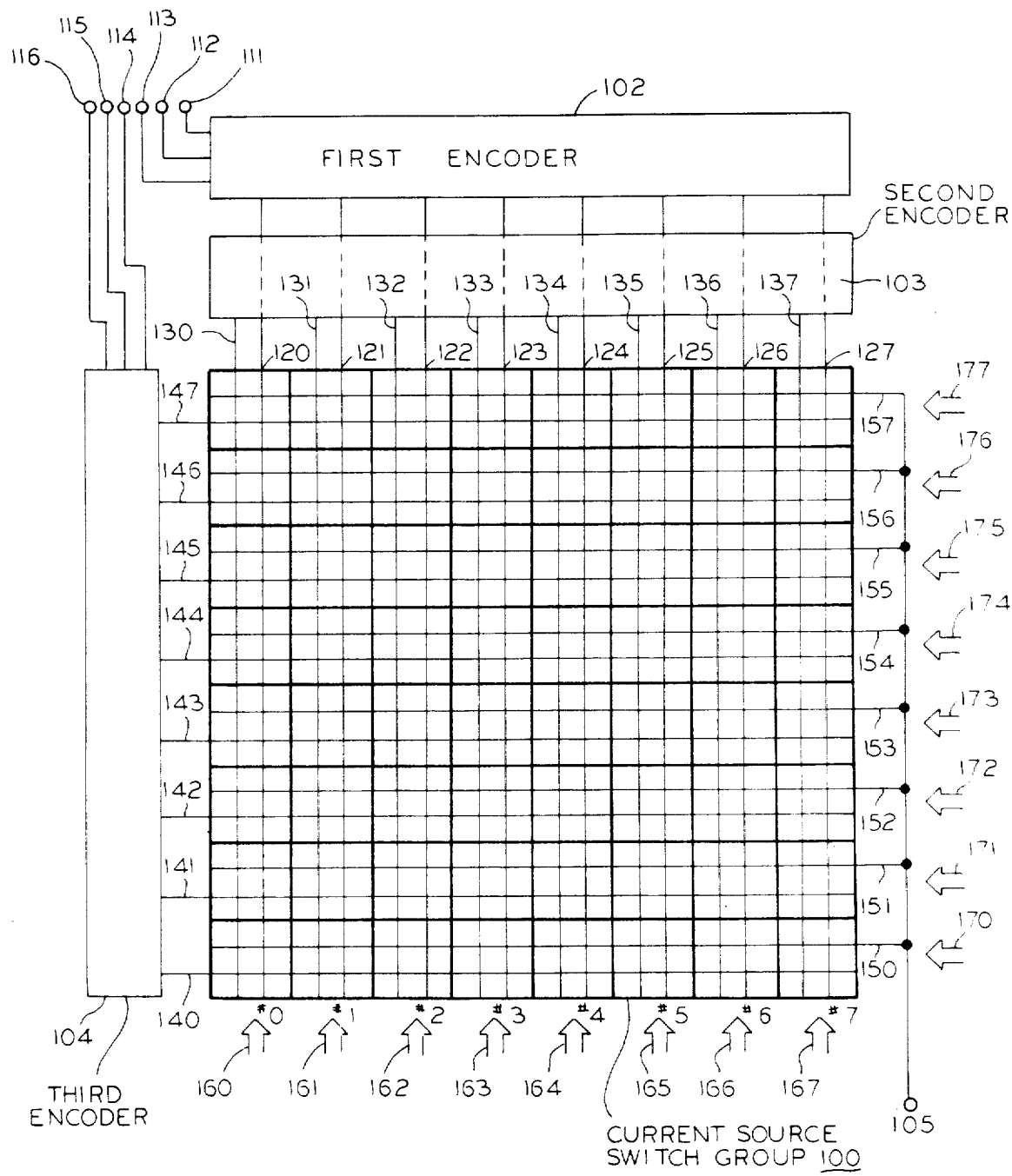
FIG. 10 is a block diagram showing another construction of the basic DAC which is available in practicing the present invention.

Now another example of the construction of the basic DAC will be described with reference to FIGS. 10 and 11. The example shown in FIG. 10 is a 6-bit DAC, in which depending upon the signals for the more significant 3 bits, the input-output range of the DAC can be equally divided into 8 segments. Here, for the digital input code having the more significant 3 bits of "000", a segment #0 is allotted, and for the codes having the more significant 3 bits of "001" to "111", respectively, segments #1 to #7 are sequentially allotted. To the segment #0 belong 8 sets of codes consisting of "000000" to "000111", to the segment #1 belong 8 sets of codes consisting of "001000" to "001111", and so on. Thus to the respective segments up to the segments up to the segment #7, respectively belong 8 sets of digital inputs codes. In the example of construction shown in FIG. 11, $2^6 = 64$ current source switch cells corresponding to the 6 bits are arrayed in a matrix form as a current source switch group 100 having a 8 rows × 8 columns construction, in which current source switches belonging to the respective columns 160~167 correspond to the segments #0 to #7, respectively, current source switches belonging to the respective rows 140~147 determine the weights in each segment. For instance, assuming now that the digital input is the code of "011101", then in response to the code of the more significant 3 bits of "011", all the current source switch cells in the segments #0 to #2 are put into an output state, in the segment #3, 6 current source switch cells corresponding to the code of the less significant 3 bits of "101" are put into an output state, and the remaining 2 current source switch cells in the segment #3 and all the current source switch cells in the segments #4, #5, #6 and #7 are put into an inhibit state, and thereby an analog output current corresponding to the input signal code of "011101" can be obtained.

Figure 11:
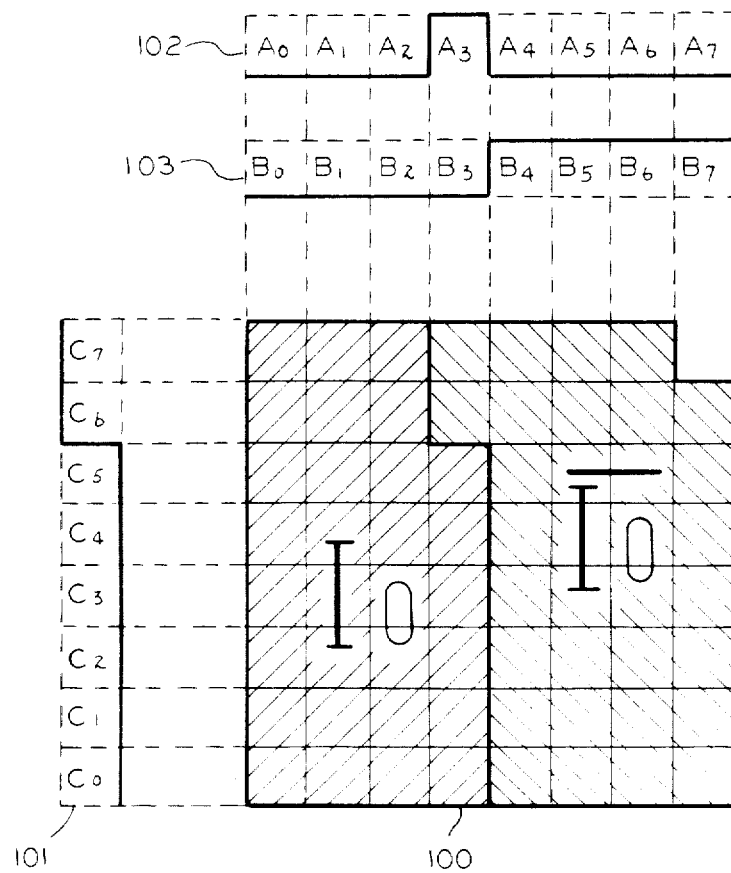
FIG. 11 is a diagram to be used for explaining the operation of the basic DAC shown in FIG. 10.

The details of the operation in the basic DAC illustrated in FIG. 10 will better understood by reference to FIG. 11. In this figure, component parts common to those shown in FIG. 10 are given like reference numerals. By way of example, description will be made on the case where a digital input signal of "011101" has been applied to this DAC. In response to the signal portion "011" for the more significant 3 bits, at the output end of the first encoder 102 only an output $A_3$ takes a high level and all the remaining outputs $A_0$ to $A_2$ and $A_4$ to $A_7$ take a low level. In response to these output signals, at the output end of the second encoder 103 outputs $B_0$ to $B_3$ take a low level and the other outputs $B_4$ to $B_7$ take a high level.

In the illustrated current source cell array 100 in which current source cells are arrayed in a matrix form, the current source switch cells led to different ones of the complementary output terminals $I_0$ and $\bar{I}_0$ are differentiated by different directions of hatchings. The outputs of all the current source switch cells included in the columns #4 to #7 to which outputs $B_4$ to $B_7$ at a high level among the outputs of the above-described second encoder 103 are applied, are led to the terminal $\bar{I}_0$ independently of the outputs $C_0$ to $C_7$ of the third encoder 104. Whereas, the current source switch cells included in the column #3 to which column the output $B_3$ at a low level of the second encoder 103 and the output $A_3$ that is the only output held at a high level of the first encoder 102 are applied, depend upon the outputs $C_0$ to $C_7$ of the third encoder 104 in such manner that the outputs of the current source switch cells included in the rows #0 to #5 to which outputs $C_0$ to $C_5$ at a low level are applied, are led to the terminal $I_0$, while the outputs of the current source switch cells included in the row #6 and #7 to which the other outputs $C_0$ and $C_7$ held at a high level are applied, are led to the terminal $\bar{I}_0$. Still further, the outputs of the current source switch cells included in the columns #0 to #2 to which columns the outputs $A_0 \sim A_2$ of the first encoder 102 and the outputs $B_0$ to $B_2$ of the second encoder 103 both held at a low level are applied, are all led to the terminal $I_0$ independently of the outputs $C_0$ to $C_7$ of the third encoder 104. It is to be noted that in FIG. 11 a current source switch cell is not disposed at the position of row #7 and column #7. In a complementary output type DAC, in some cases it is necessary to make the $\bar{I}_0$ output zero for the input code of "111111". In such cases, the current source switch cell at the position of row #7 and column #7 can be omitted in practice as shown in FIG. 11.

Figure 12:
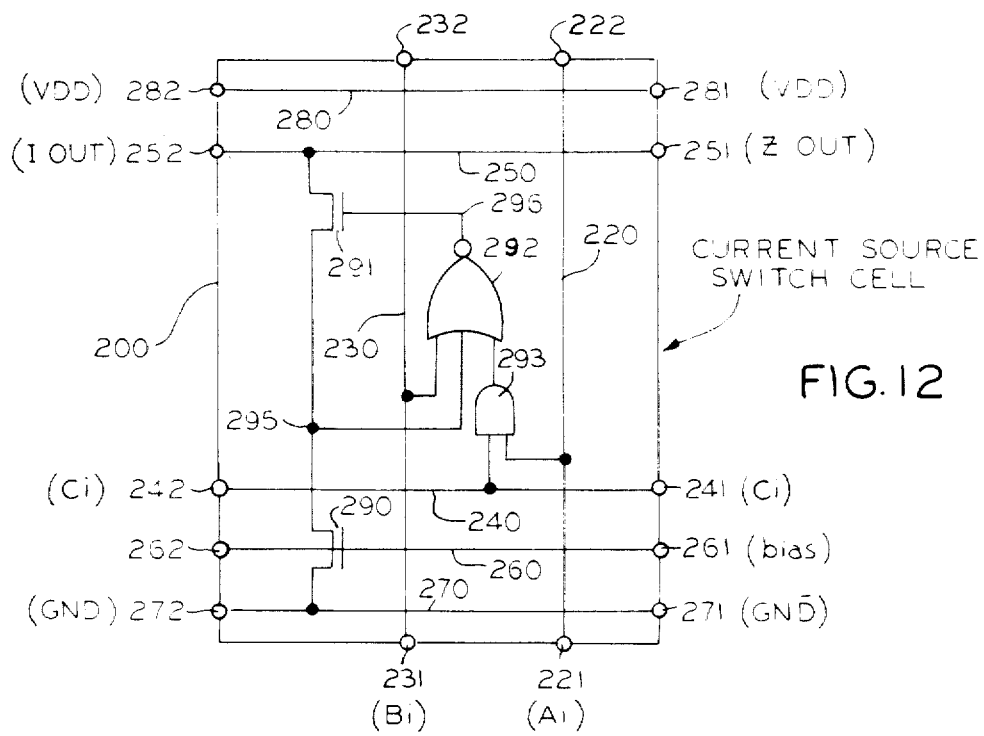
FIG. 12 is a block diagram showing a construction of a current source cell which is available in the basic DAC shown in FIG. 10.

A basic circuit construction 200 of the current source switch cell is illustrated in FIG. 12. This example of a current source switch cell relates to a switch cell adapted to make ON-OFF operations, and it is suitable for use in the cell group 100 in the example of the basic DAC shown in FIG. 11. A power supply wiring 280 can be automatically connected through terminals 281 and 282 to current source switch cells disposed at the adjacent positions. Likewise, a ground wiring 270 is connected to a source of a FET 290 and connected through terminals 271 and 272 to the adjacent cells. A wiring 260 for feeding a gate bias voltage which is connected to the gate of the FET 290 and connected through terminals 261 and 262 to the adjacent cells. An analog output wiring 250 is connected to a drain of a FET 291 and connected through terminals 251 and 252 to the adjacent cells. An output signal line 220 of the aforementioned first encoder 102 which is connected through terminals 221 and 222 to the adjacent cells. An output signal line 230 of the second encoder 103 which is connected through terminals 231 and 232 to the adjacent cells. An output signal line 240 of the third encoder 104 which is connected through terminals 241 and 242 to the adjacent cells. As described previously, when the respective current source switch cells are disposed in a matrix shape of array, every wiring in any switch cell can be automatically connected to other current source switch cells disposed at adjacent positions.

A current source FET 290 is biased in common through the wiring 260. By forming the current source FETs 290 in all the current source switch cells in the same shape, every current source switch cell can switch ON and OFF a unit current, and there current source switch cells can jointly form a basic DAC whose input-output characteristics have a linear relation. The drain of the current source FET 290 is connected to the source of the switch FET 291. The gate of the switch FET 291 is biased by an output of a multi-input logic gate, that is an AND-NOR circuit designated by reference numerals 292 to 293. For this multi-input logic gate 292 to 293, various combinations of logic elements can be constructed depending upon the positive or negative logic level of the control signal, whether the FETs are of P-channel type or of N-channel type, and the like, but in the illustrated circuit, by way of example, an AND-NOR circuit construction is employed. A first input terminal of a 2-input AND circuit 293 is connected to an output signal line 220 of the first encoder 102, and a second input terminal of the same is connected to an output signal line 242 of the third encoder 104. The output of the 2-input AND circuit 293 is connected to a first input terminal of a 3-input NOR circuit 292, and a second input terminal of the 3-input NOR circuit 292 is connected to an output signal line 230 of the second encoder 103. A third input of the same is connected to a common junction between the drain of the current source FET 290 and the source of the switch FET 291.

Now description will be made on the operations of the above-described current source switch cell. When the level of the output signal of the second encoder 103 applied via the wiring 230 to the second input of the NOR circuit 292 becomes high, the output of the NOR circuit 292 takes a low level regardless of the levels at the other input terminals thereof, and hence the switch FET 291 becomes cut off. Therefore, the output signal of the second encoder 103 acts as an inhibit signal.

On the other hand, when the level of the output signal of the second encoder 103 is at a low level, the inhibit state of the cell is released, and the output state of the cell is controlled by the output signals of the first and third encoders 102 and 104. When the level of the output signal of the first encoder 102 applied to the first input terminal of the AND circuit 293 is at a low level, the output of the AND circuit 293 takes a low level regardless of the level of the output signal of the third encoder 104 that is applied to the second input terminal of the AND circuit 293, hence the first and second input terminals of the NOR circuit 292 both take a low level, and therefore, the NOR circuit 292 acts as an inverter-amplifier having the third input terminal connected to a junction 295 as an input and output 296 of the NOR circuit 292 as an output, so that the switch FET 291 is feedback-biased to be turned ON, and this switch cell outputs a current to the output line 250.

On the other hand, when the level of the output signal of the second encoder 103 is at a low level and thereby the inhibit state of the cell has been released, if the level of the output signal of the first encoder 102 applied to the first input terminal of the AND circuit 293 is inverted to a high level, then the output state of the cell is determined depending upon the level of the output signal of the third encoder 104 applied to the second input terminal of the AND circuit 293. When the level at the second input terminal of the AND circuit 293 is a high level, the output of the AND circuit 293 becomes a high level, hence the output of the NOR circuit 292 is turned to a low level, thus the switch FET 291 is cut off, and therefore, the cell takes an OFF (inhibit) state. On the other hand, when the level at the second terminal of the AND circuit 293 is turned to a low level, the output of the AND circuit 293 becomes a low level, so that the NOR circuit 293 acts as an inverter-amplifier having the terminal 295 as an input and the terminal as an output, hence the switch FET 291 is feedback-biased and thus turned ON, and therefore, this cell outputs a current to the outline line 250.

As described above, the current source switch cell illustrated in FIG. 12 can achieve the intended operation as a basic constitutive element of the DAC shown in FIG. 10. Moreover, this current source switch cell has greatly improved the output impedance without complexing the construction of the analog current switches in the prior art, and it provides a favorable embodiment of the present invention for realizing a DAC having an extremely excellent output compliance characteristic in the form of a monolithic integrated circuit. The output compliance characteristic of a DAC implies suppression characteristic of an output current variation for an voltage amplitude at an analog current output terminal, and it is one of fundamental characteristics of a current output type DAC. With a DAC having an insufficient output compliance characteristic, it is impossible to realize a satisfactory precision for a wide range of output terminal voltage amplitudes.

In the current source switch cell shown in FIG. 12, when the first and second input terminals of the NOR circuit 292 have been first held at a low level and thus the NOR circuit 292 acts as an inverter-amplifier, a closed feedback loop is formed from the source of the switch FET 291 at its gate. Assuming now that the switch FET 291 and the current source FET 291 are formed in the same shape, and if transconductances of these FETs are represented to gm, their output impedances by $\gamma_o$, the drain potential of the switch FET 291, that is, the potential at the output terminal by $V_5$, the potential at the common junction 295 between the source of the switch FET 291 and the drain of the current source FET 290 by $V_{295}$, the output current by $I_5$ and the gate bias voltage of the current source FET 290 by $V_G$, then the output current $I_5$ can be approximated as follows:

$$I_5 = (V_5 - V_{295})/\gamma_o + \mu \cdot gm \cdot V_{295}$$

$$= \frac{V_5/r_o + (1 - \mu \cdot gm \cdot \gamma_o)gm \ V_4}{2 - \mu \cdot gm \cdot \gamma_o}$$

Then the output conductance is derived as follows:

$$\frac{I_5}{V_5} \approx \frac{1}{\mu \cdot (gm \cdot \gamma_o)\gamma_o}$$

where $(-\mu)$ is the gain of the NOR circuit 292 acting as an inverter-amplifier. The output impedance (the reciprocal of the output conductance) obtained by making use of a simple differential current switch form in the prior art was $(gm.\gamma_o).\gamma_o$, and therefore, in the case of the cell shown in FIG. 12, a further improvement by a factor of $\mu$ has been achieved. It has been well known by those skilled in the art that the gain $\mu$ of an NOR circuit operating as an inverter-amplifier can be easily chosen at 10 or more. In the experiments conducted by the inventor of this invention, the variations of the output current for an amplitude of 10 V of the output voltage was 0.0375%, and hence the variation rate was 0.000375%/V.

The value of the least significant bit (LSB) in a 12-bit DAC with respect to its full scale value is about 0.025%, and so, if an error corresponding to 1 LSB is tolerable, then in a DAC employing the current source switch cells according to the present invention, an amplitude of 64 V is tolerable. On the other hand, in the case where the simple differential analog current switches are employed, the performance is degraded by a factor of $1/\mu$. Since the gain $\mu$ of the inverter-amplifier employed in our experiments was 16, in the case where the differential analog current switches in the prior art are employed, the tolerable output amplitude would be greatly reduced to 4 V.

Figure 13:
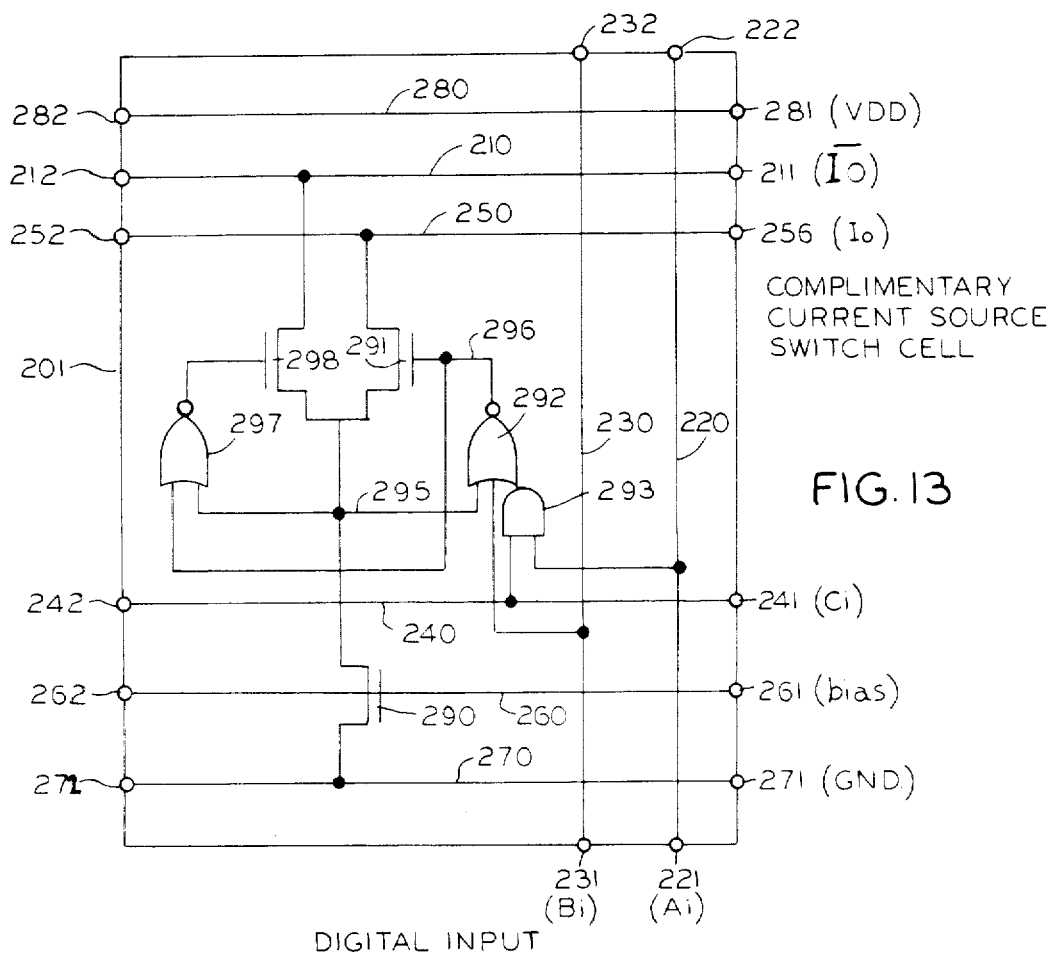
FIG. 13 is a block diagram showing another construction of the same current source cell.

FIG. 13 shows a complementary output type current source switch cell according to another preferred embodiment of the present invention, in which an complementary output terminal ($\bar{I}_0$), a differential switch MOS FET 298 and a NOR circuit 297 are added to the current source switch cell in FIG. 12.

This preferred embodiment provides a current source switch cell that is suitable to be applied to a complementary output type DAC. Component parts common to FIG. 12 are given like reference numerals. When the output of the NOR circuit 292 is at a low level, the NOR circuit 297 acts as an inverter-amplifier having the junction 254 connected to its input, hence the FET 298 is feedback-biased, and the output at the drain of the FET 298 is led to the output terminal $\bar{I}_0$. On the other hand, when the NOR circuit 292 acts as an inverter-amplifier and thus the FET 291 is feedback-biased, the junction 296 provides a high level as an input level to the NOR circuit 297, hence the output of the NOR circuit 297 is turned to a low level, and therefore the FET 298 is cut off. As described above, the switch cell illustrated in FIG. 13 carries out a complementary output operation, and so, it is a circuit having an excellent performance equivalent to the cell shown in FIG. 12. In the known construction of DACs, since current source switch cells corresponding to 1 LSB are arrayed, the above-described differential linearity is very excellent.

A differential nonlinearity error implies an error of a variation in an analog output in response to a change of 1 LSB (the least significant bit unit) in every step of the digital input covering the codes of "000000000" to "111111111" with respect to the ideal amount of variation in response to a change of 1 LSB.

If digital-analog converters whose differential nonlinearity error is essentially small such as described above are employed as the basic DACs in the digital-analog converter according to the present invention, then a digital-analog converter having a very high precision in which both the linearity error and the differential nonlinearity error are reduced, can be realized in a monlithic integrated circuit.

The gaps between the respective steps of the analog output issued from a digital-analog converter whose differential nonlinearity error is small and further whose linearity error is also small, become possible to be further analyzed, and so, the digital-analog converter according to the present invention can provide effective circuit means for constructing a digital-analog converter having a higher resolution.

According to the integrated circuit technology at present, it has become possible to obtain a relative precision of elements of about 0.5~0.2% at a mass-production level. This implies that a differential nonlinearity of about 1/200~1/500 LSB can be realized with the know method of construction of DACs.

Figure 14:
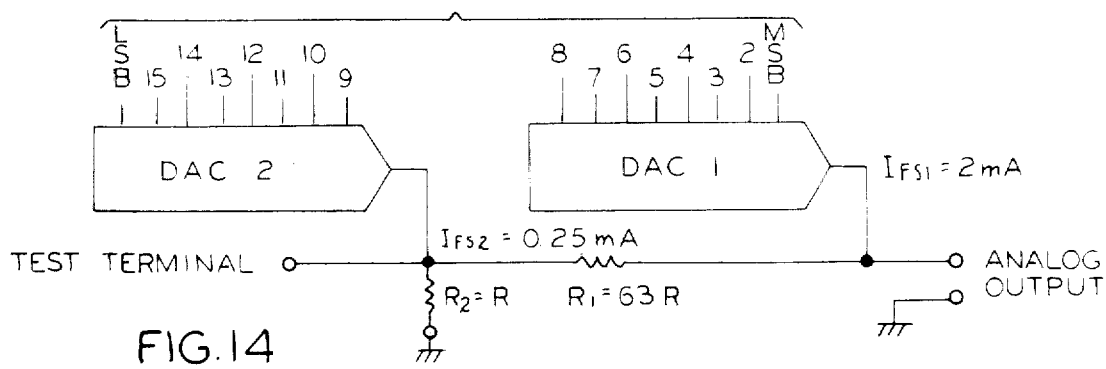
FIGS. 14 and 15 are diagrams showing practical embodiments of the present invention.

FIG. 14 shows one example of application of the present invention to a high-precision digital-analog converter, in which the digital-analog converter according to the present invention whose linearity error and whose differential nonlinearity error are both small is used as a DAC for the more significant bits. In this circuit arrangement, a digital-analog converter DAC-1 according to the present invention is connected in correspondence to the more significant bit group in the digital input, and a digital-analog converter DAC-2 having any arbitrary construction is connected in correspondence to the less significant bit group, so that an analog voltage output may be derived between output terminals of a resistor network comprising resistors $R_1$ and $R_2$. In the illustrated example, it is assumed that the full scale output current $I_{FS1}$ of the more significant bit group digital-analog converter DAC-1 is $I_{FS1}=2$ mA, whereas the full scale output current $I_{FS2}$ of the less significant bit group digital-analog converter DAC-2 is $I_{FS2}=0.25$ mA. Then, representing the resistance ratio of $R_1:R_2$ in terms of a ratio $K=I_{FS1}/I_{FS2}$, the ratio is as follows:

$$R_1:R_2=2^m-K:K$$

where m is a resolution of the more significant bit group digital-analog converter DAC-1 as represented in terms of a number of bits. By presetting the resistance ratio $R_1:R_2$ at the above-described ratio, it becomes possible to equally divide the gap width of 1 LSB of the more significant bit group digital-analog converter DAC-1 by means of the less significant bit group digital analog converter DAC-2. In the example shown in FIG. 14, for the above-assumed values of $I_{FS1}=2$ mA and $F_{FS2}=0.25$ mA, we can derive the following numerical values of the resistance ratio:

$$K = \frac{2.0 \, mA}{0.25 \, mA} = 8, m = 8 \text{ (bits)}$$

hence $$R_1:R_2=256-8:8=31:1$$

A resistor network having such an integral ratio between resistances can be easily realized in a monolithic integrated circuit. Thus, in addition to a resolution of 8 bits (1/256) of the less significant bit group digital-analog converter DAC-2, a digital-analog converter having an overall resolution of 16 bits can be constructed.

Figure 15:
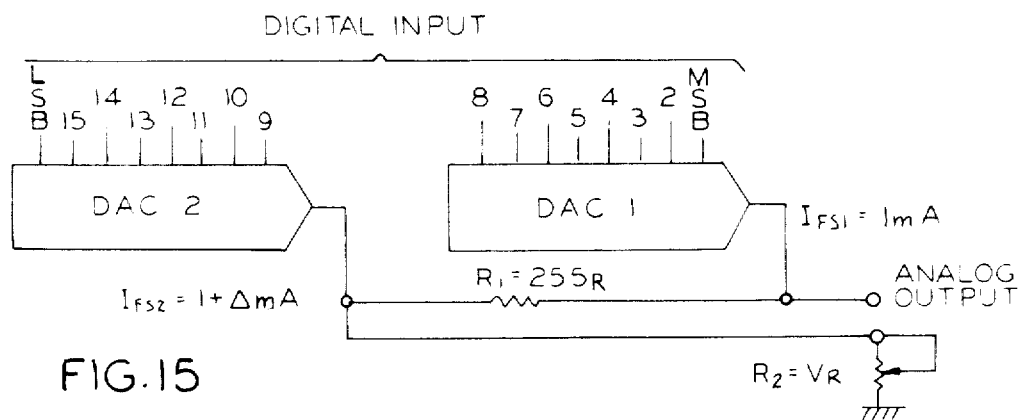

FIG. 15 shows another example of application of the present invention, in which for the resistor $R_2$ in the resistor network a variable resistor $V_R$ is used. According to this example, even in the event that the full scale current ratio between the DAC-1 and the DAC-2 is not an integral ratio but has some error or the resistance ratio in the case illustrated in FIG. 14 has some error, a resolution can be raised by fine adjustment of the addition resistance ratio $R_1:R_2$. In this adjustment work, for instance, the optimum point can be obtained through a single adjustment operation of minimizing a high frequency distortion contained in an output derived by subjecting a digital coded since wave input to digital-analog conversion, and so, the adjustment work is very simple.

With regard to the construction of the less significant bit group DAC in the above-described digital-analog converter, any type of DAC is available, and for instance, the construction shown in FIGS. 10 and 11 could be employed.

Figure 16:
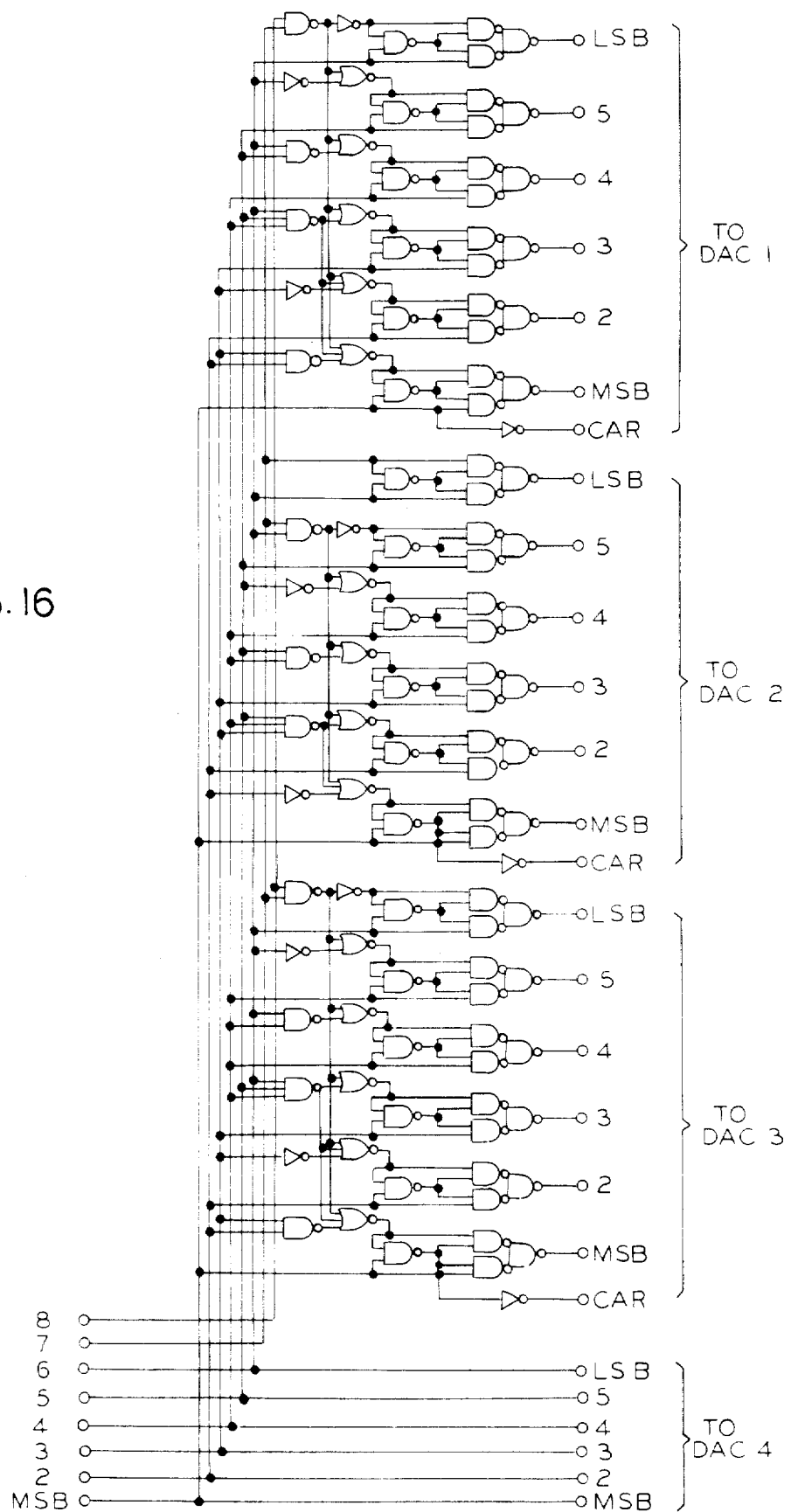
FIG. 16 shows a circuit for dividing 8-bit data into four 6-bit data, which circuit can be used in practicing the present invention.

FIG. 16 shows one example of a full-adder circuit for dividing 8-bit data at its input into 4 sets of 6-bit data to be applied to 4 basic DACs as is the case with the example shown in FIG. 5 and FIG. 9.

As one skilled in the art will easily understand from FIG. 16, the more significant six bits (i.e. the first to sixth bits) of the input digital data are supplied to one (DAC 4) of the four basic DACs. The two less significant bits (i.e. the seventh and eighth bits) are supplied to an arithmetic circuit together with the more significant six bits. The arithmetic circuit produces data which is to be supplied to another one (DAC 3) of the basic DACs. In greater detail, the less significant two bits are subjected to a logical AND operation and the resultant logical product is added to the more significant six bits. Consequently, the DAC 3 is supplied with 6-bit data. Only the second least significant bit (i.e. the seventh bit) of the input digital data is logically added to the more significant 6-bits in the arithmetic circuit. The resultant 6-bits are supplied to a third one (DAC 2) of the basic DACs. Further, the data for the last one (DAC 1) of the basic DACs is produced by a logic circuit performing a logical OR operation of the less significant 2-bits. Then, there is a logical addition of the resultant logical sum to the more significant 6-bits. While various methods for dividing data can be conceived, in this figure is illustrated only one example.

As described in detail above, the digital-analog converter according to the present invention can provide a circuit arrangement for realizing a high-resolution digital-analog converter that can be mass-produced with a simple construction.

We claim:

1. A digital-to-analog converter apparatus comprising first digital-to-analog converting means responsive to more significant bits of input digital signals for generating a first analog signal corresponding to said more significant bits of said input digital signal, arithmetic means responsive to said more significant bits and the least significant bit of said input digital signal for performing a logical addition of said more significant bits and said least significant bit, second digital-to-analog converting means responsive to an output of said arithmetic means for generating a second analog signal corresponding to said output of said arithmetic means, and summing means for summing said first and second analog signals to produce an analog output signal corresponding to said input digital signal.

2. The digital-to-analog converter apparatus as claimed in claim 1, wherein said arithmetic means includes a plurality of adder circuits to add said least significant bit to said more significant bits.

3. The digital-to-analog converter apparatus as claimed in claim 2, wherein each of said adder circuits has first and second input ends, an output end and a carry output end, means for supplying said least significant bit to a first input end of one of said adder circuits and for supplying one of said more significant bits to a second input end of said one adder circuit, means for supplying other of said more significant bits to a first input end of each of the other of said adder circuits, and means for supplying a carry signal produced by a preceding adder circuit to a second input end of the other of said adder circuits.

4. An apparatus comprising first digital-to-analog converter means responsive to more significant bits of input digital signals for generating a first analog output signal corresponding to said more significant bits of said input digital signal, first arithmetic circuit means for obtaining a logical product of two less significant bits of said input digital signal and for logically adding the logical product of said two less significant bits to said more significant bits of said input digital signal, second digital-to-analog converter means responsive to an output of said first arithmetic circuit means for generating a second analog output corresponding to said output of said first arithmetic circuit means, second arithmetic circuit means for obtaining a logical sum of said two less significant bits and for logically adding the logical sum of said two less significant bits to said more significant bits of said input digital signal, third digital-to-analog converter means responsive to an output of said second arithmetic circuit means for generating a third analog output corresponding to said output of said second arithmetic circuit means, third arithmetic circuit means for logically adding one of said two less significant bits other than the least significant bit to said more significant bits of said input digital signal, fourth digital-to-analog converter means responsive to an output of said third arithmetic circuit means for generating a fourth analog output corresponding to said output of said third arithmetic circuit means, and summation circuit means for summing said first, second, third and fourth analog outputs to produce an analog signal corresponding to said input digital signal.

5. The apparatus as claimed in claim 4, wherein said first arithmetic circuit means has at least one adder circuit means supplied with said logical product of said two less significant bits and said more significant bits to add said logical product of said two less significant bits to said more significant bits, and said second arithmetic circuit means has at least one adder circuit supplied with said logical sum of said two less significant bits and said more significant bits to add said logical sum of said two less significant bits to said more significant bits, said third arithmetic circuit means having at least one adder circuit supplied with said one of said two less significant bits and more significant bits to add said one of said two less signficiant bits to more significant bits.

6. An apparatus for converting an input digital signal to a corresponding analog signal comprising a plurality of digital-to-analog converter means, each of said converter means generating an analog output corresponding to input binary coded data supplied thereto, means responsive to said input digital signal for applying one of said converter means with binary coded data formed from the more significant bits of said input digital signal, means responsive to a binary state of at least one of less significant bits of said input digital signal for supplying remaining ones of said converter means with either one of said binary coded data formed from said more significant bits and binary coded data obtained by incrementing by one of said binary coded data formed from said more significant bits, and means for summing analog outputs derived from the respective converter means for producing an analog signal corresponding to said input digital signal.

7. A digital-to-analog converter for converting input digital data into a corresponding analog signal comprising first converter means responsive to more signficant bits of said input digital data for generating a first analog output corresponding to said more signficiant bits of said input digital data, first arithmetic circuit means for logically adding one of less signficant bits of said input digital data to said more signficiant bits, second converter means responsive to an output of said first arithmetic circuit means for generating a second analog output corresponding to said output of said first arithmetic circuit means, second arithmetic circuit means for logically adding a logical product of said less signficant bits to said more signficant bits, third converter means responsive to an output of said third arithmetic circuit means for generating a third analog output corresponding to said output of said second arithmetic circuit means, third arithmetic circuit means for logically adding a logical sum of said less significant bits to said more significant bits, fourth converter means responsive to an output of said third arithmetic circuit means for generating a fourth analog output corresponding to said output of said third arithmetic circuit means, and summation circuit means for summing the analog outputs generated from the respective converter means to produce an analog signal corresponding to said input digital data.

8. An apparatus comprising a first digital-to-analog converter means responsive to more significant bits of input digital signals for generating first analog signals corresponding to said more significant bits, second digital-to-analog converter means responsive to less significant bits of said input digital signals for generating second analog signals corresponding to said less significant bits, arithmetic circuit means responsive to input bits other than those supplied to said first and second digital-to-analog converter means and to said more significant bits for producing arithmetic logical outputs of said input bits and said more significant bits, at least one third digital-to-analog converter means responsive to said arithmetic logical outputs of said arithmetic circuit means for generating a third analog signal corresponding to said arithmetic logical outputs, and means for summing said first, second and third analog signals to produce an analog output signal corresponding to said input digital signal.

9. The apparatus as claimed in claim 8, wherein said summing means includes first and second resistors connected in series between an output terminal of said summing means and a reference potential point, said second analog signal generated from said second digital-to-analog converter being supplied to the connection point of said first and second resistors, said first and third analog signals respectively generated from said first and third digital-to-analog converter means being supplied to the connection point of said first resistor and said output terminal of said summing means.

* * * * *